United States Patent
Koss

(10) Patent No.: US 8,519,703 B2
(45) Date of Patent: Aug. 27, 2013

(54) MAGNETIC SENSOR DEVICE AND METHOD OF DETERMINING RESISTANCE VALUES

(75) Inventor: Sebastian Koss, Reutlingen (DE)

(73) Assignee: Infineon Technologies AG, Neubiberg (DE)

( * ) Notice: Subject to any disclaimer, the term of this patent is extended or adjusted under 35 U.S.C. 154(b) by 1170 days.

(21) Appl. No.: 12/052,310

(22) Filed: Mar. 20, 2008

(65) Prior Publication Data

US 2009/0237075 A1 Sep. 24, 2009

(51) Int. Cl.
*G01R 33/09* (2006.01)

(52) U.S. Cl.
USPC .......................................................... 324/252

(58) Field of Classification Search
USPC .......................................... 324/252, 210–212
See application file for complete search history.

(56) References Cited

U.S. PATENT DOCUMENTS

| | | | | |
|---|---|---|---|---|
| 5,159,513 A * | 10/1992 | Dieny et al. | ............... | 360/324.1 |
| 5,206,590 A | 4/1993 | Dieny et al. | | |
| 5,287,238 A * | 2/1994 | Baumgart et al. | ............ | 360/314 |
| 5,408,377 A * | 4/1995 | Gurney et al. | ................ | 360/325 |
| 5,627,704 A * | 5/1997 | Lederman et al. | ............ | 360/321 |
| 5,854,554 A * | 12/1998 | Tomita et al. | ................. | 324/210 |
| 6,025,979 A * | 2/2000 | Yamane et al. | ............ | 360/324.1 |
| 6,194,896 B1 * | 2/2001 | Takahashi et al. | ............. | 324/252 |
| 6,255,814 B1 * | 7/2001 | Shimazawa et al. | .......... | 324/252 |
| 6,642,714 B2 * | 11/2003 | Kobayashi et al. | ........... | 324/252 |
| 6,984,978 B2 * | 1/2006 | Wan et al. | ...................... | 324/252 |
| 7,234,360 B2 | 6/2007 | Quandt et al. | | |
| 7,312,609 B2 | 12/2007 | Schmollngruber et al. | | |
| 7,382,584 B2 * | 6/2008 | Liu et al. | ........................ | 360/313 |
| 7,932,717 B2 * | 4/2011 | Beach et al. | ................... | 324/210 |
| 2001/0014412 A1 * | 8/2001 | Jongill et al. | ................. | 428/692 |
| 2002/0114112 A1 * | 8/2002 | Nakashio et al. | .......... | 360/324.2 |
| 2004/0115839 A1 * | 6/2004 | Sugita et al. | ...................... | 438/3 |
| 2004/0212360 A1 * | 10/2004 | Sato et al. | ..................... | 324/200 |
| 2008/0084205 A1 * | 4/2008 | Zimmer | ........................ | 324/252 |
| 2008/0186023 A1 * | 8/2008 | Biziere et al. | ................. | 324/252 |
| 2008/0191694 A1 * | 8/2008 | Barton et al. | ................. | 324/252 |
| 2008/0204011 A1 * | 8/2008 | Shoji | .............................. | 324/252 |
| 2009/0051357 A1 * | 2/2009 | Sasaki | ........................... | 324/228 |
| 2009/0168215 A1 * | 7/2009 | Beach et al. | .................... | 360/31 |

* cited by examiner

*Primary Examiner* — Jay Patidar
(74) *Attorney, Agent, or Firm* — Dicke, Billig & Czaja, PLLC

(57) ABSTRACT

A magnetoresistance sensor has a first magnetic layer that changes polarity in response to an external magnetic field and a second magnetic layer having a fixed magnetic polarity oriented in a reference direction. A varying voltage is applied to establish a varying magnetic bias field in the reference direction. An evaluation circuit calculates the difference between maximum and minimum resistance values established in response to the external magnetic field.

16 Claims, 5 Drawing Sheets

MAGNETIC SENSOR DEVICE AND METHOD OF DETERMINING RESISTANCE VALUES

BACKGROUND

The resistance of sensors based on Magnetoresistance (MR), such as Giant Magnetoresistance (GMR) or Tunnel Magnetoresistance (TMR) sensors, varies when an external magnetic field is applied to the sensor device. GMR/TMR "spin valve" sensors typically have two magnetic layers separated by a non-magnetic layer. The two magnetic layers are made from materials having different hysteresis curves so one layer ("soft" layer) changes polarity while the other ("hard" layer) has a fixed polarity.

As large a measuring range as possible is desirable, along with high accuracy. In practice, however, the accuracy of known GMR/TMR devices can be limited by hysteresis, and the measuring range can be limited by the saturation field strength.

SUMMARY

An electronic device includes a magnetoresistance sensor stack with a first magnetic layer that changes polarity in response to an external magnetic field and a second magnetic layer having a fixed magnetic polarity oriented in a reference direction. Conductive terminals are situated proximate the first and second magnetic layers for receiving a varying voltage to establish a varying magnetic bias field in the reference direction. An evaluation circuit calculates the difference between maximum and minimum resistance values established in response to the external magnetic field.

BRIEF DESCRIPTION OF THE DRAWINGS

Embodiments of the invention are better understood with reference to the following drawings. The elements of the drawings are not necessarily to scale relative to each other. Like reference numerals designate corresponding similar parts.

DETAILED DESCRIPTION

In the following Detailed Description, reference is made to the accompanying drawings, which form a part hereof, and in which is shown by way of illustration specific embodiments in which the invention may be practiced. In this regard, directional terminology, such as "top," "bottom," "front," "back," "leading," "trailing," etc., is used with reference to the orientation of the Figure(s) being described. Because components of embodiments of the present invention can be positioned in a number of different orientations, the directional terminology is used for purposes of illustration and is in no way limiting. It is to be understood that other embodiments may be utilized and structural or logical changes may be made without departing from the scope of the present invention. The following detailed description, therefore, is not to be taken in a limiting sense, and the scope of the present invention is defined by the appended claims.

Figure 1:
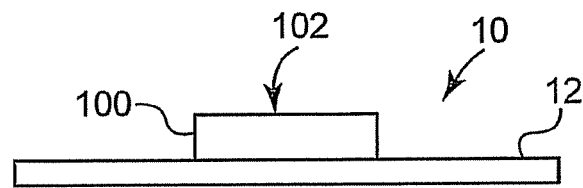
FIG. 1 is a block diagram conceptually illustrating aspects of an embodiment of a sensing system.

FIG. 1 is a block diagram conceptually illustrating aspects of a sensing system 10 in accordance with embodiments of the present invention. The system 10 includes a substrate 12 and a magnetoresistance (MR) sensor 100, such as a GMR or TMR sensor, mounted to the substrate 12. The sensor 100 is typically implemented in an integrated circuit and includes a planar sensor surface 102.

Figure 2:
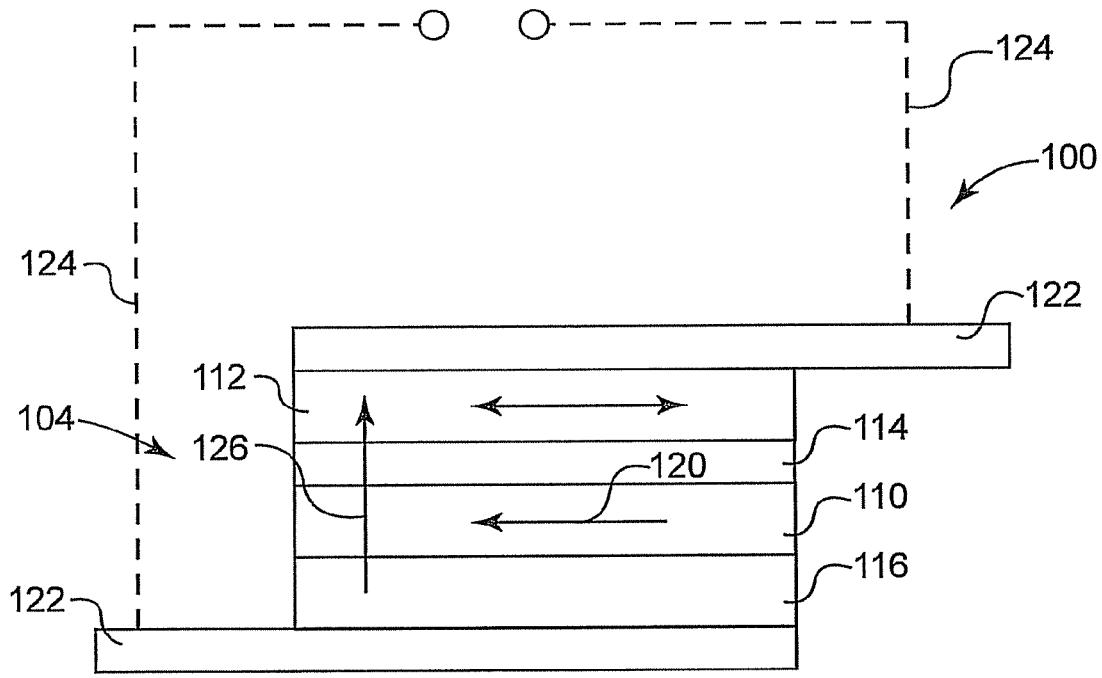
FIG. 2 is a side sectional view conceptually illustrating portions of an embodiment of a magnetoresistance sensor.

FIG. 2 is a side sectional view conceptually illustrating portions of an embodiment of the sensor 100. In the illustrated embodiment, the sensor 100 is a GMR/TMR "spin valve" sensor. The sensor 100 includes a stack 104 with first and second magnetic layers 110, 112 separated by a non-magnetic layer 114. The two magnetic layers are made of ferromagnetic material, with one layer ("soft" layer) 114 changing polarity with an external magnetic field while the other layer ("hard" layer) 112 has a fixed reference polarity. An antiferromagnet layer 116 situated to fix the magnetization of the second layer 112 in the illustrated embodiment. The direction of the fixed polarity is referred to as the "reference direction" 120. In some embodiments, the sensor 100 has a shape anisotropy.

Conductors 122 are coupled to the magnetic layers 112, 114 for connecting the sensor 100 to electrical lines 124, and an arrow 126 indicates the electric current flow. In this disclosure, the terms coupled and connected, along with derivatives and other similar terms are meant to indicate that the relevant elements co-operate or interact with each other regardless of whether they are in direct physical or electrical contact.

Figure 3:
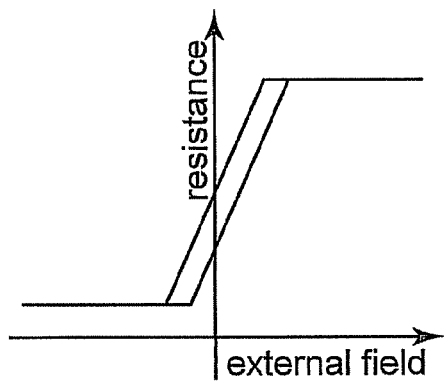
FIG. 3 illustrates an output curve for a magnetoresistance sensor.
Figure 4:
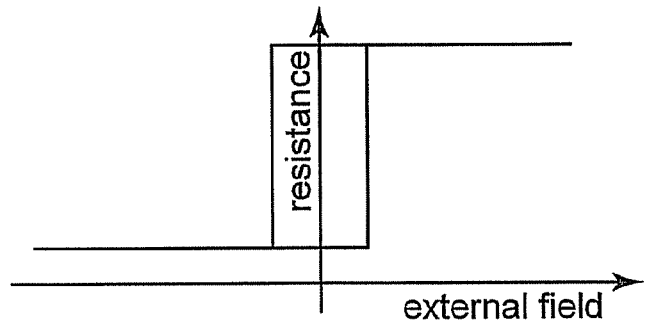
FIG. 4 illustrates an output curve for a magnetoresistance sensor without anisotropy.

Sensors such as the sensor 100 can be used to measure the angle or amplitude of an external magnetic field. If measuring the amplitude, the external magnetic field is typically applied parallel to the reference direction and an anisotropy axis is situated perpendicular to the reference direction. FIG. 3 conceptually illustrates a typical output curve. Without the anisotropy, the sensor would switch at some defined field value, as illustrated in FIG. 4. The higher the value of the anisotropy, the flatter the slope of the resistance vs. field curve of the sensor. High anisotropy also reduces hysteresis. For example, the anisotropy can be produced by an external bias field. The dynamic range of the sensor is then same magnitude as the bias field.

Figure 5:
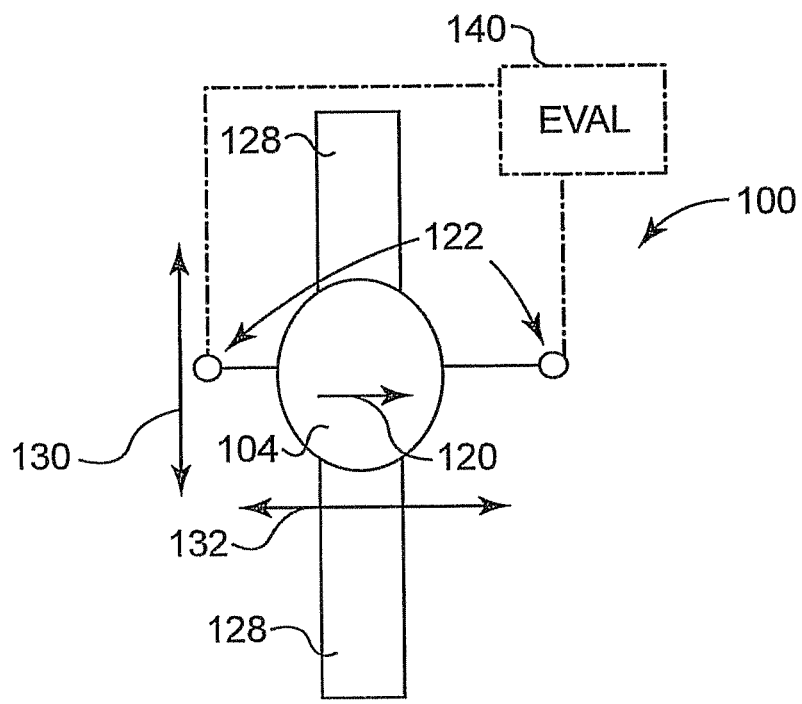
FIG. 5 is a schematic top view conceptually illustrating an embodiment of a magnetoresistance sensor.
Figure 6:
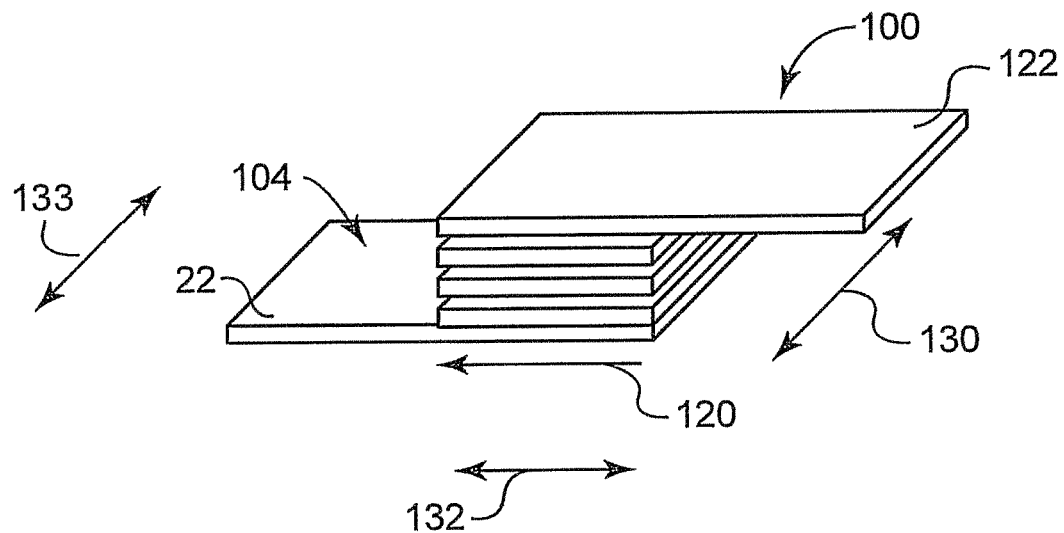
FIG. 6 is a schematic perspective view conceptually illustrating an embodiment of a magnetoresistance sensor.
Figure 7:
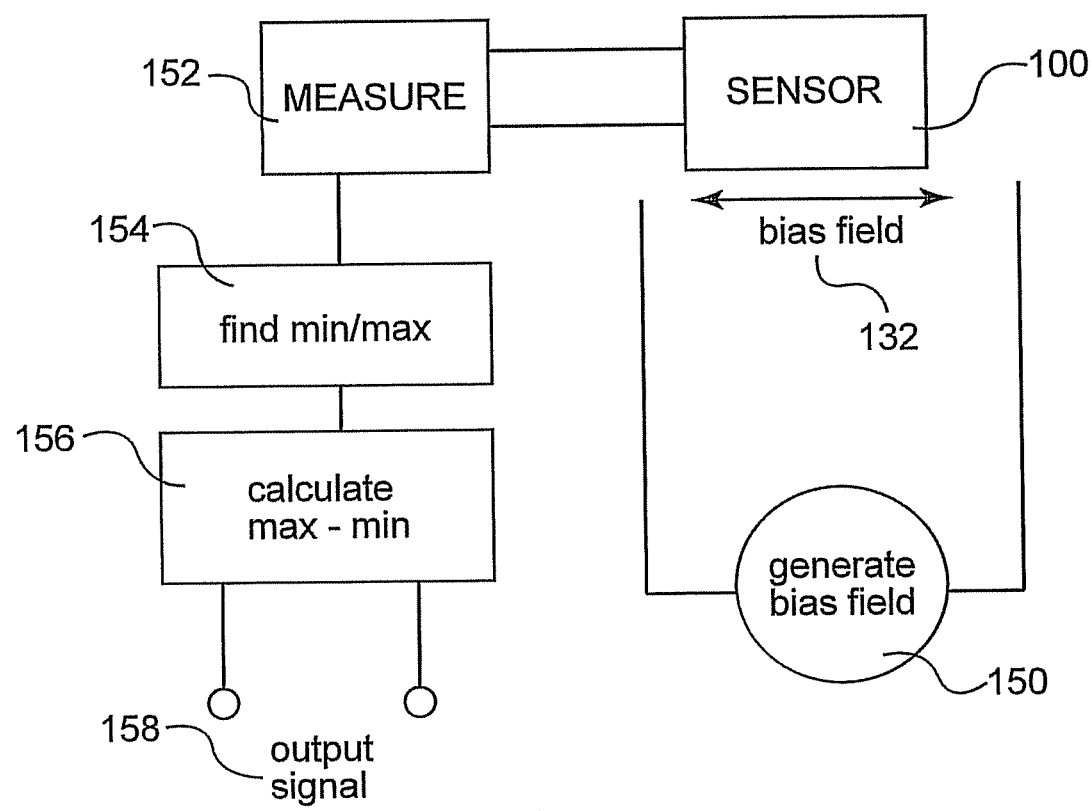
FIG. 7 is a block diagram conceptually illustrating operation of an embodiment of a magnetoresistance sensor.

FIGS. 5 and 6 are schematic top and perspective views, respectively, conceptually illustrating embodiments of the sensor 100 in which an external magnetic field 130 is applied generally perpendicular to the reference field 120. FIG. 7 is a block diagram conceptually illustrating operation of the sensor 100. A voltage source 150 is coupled to a conductive member 128 to establish a varying, or alternating magnetic bias field 132 that is applied in the direction of the reference field 120. The bias field 132 is applied generally parallel, though not necessarily exactly parallel, to the reference direction 120. The conductive member 128 is situated proximate, but electrically isolated from the sensor stack 104. In some embodiments, the conductive member 128 runs under the sensor stack 104 and can be incorporated into the integrated circuit embodying the sensor 100. The external field 130 thus provides anisotropy. The varying bias field 132 produces a signal from which sensitivity and the measuring field can be determined.

Terminals 122 are coupled to the sensor stack 104, and based on the varying bias field 132, resistance measurements are made in block 152 of FIG. 7, and the maximum and minimum resistance values of the sensor 100 are determined in block 154. An analog or digital evaluation circuit 140 is coupled to the output thermals 122 to implement the resistance measurements. The evaluation circuit 140 may be implemented in discrete circuits, partially integrated circuits or fully integrated circuits and/or software. The difference between the maximum and minimum resistance values is calculated in block 156 and provided as an output signal 158. This difference between the maximum and minimum resistance values is a function of the external magnetic field 130, which is perpendicular or nearly perpendicular to the reference direction 120. The external magnetic field 130 perpendicular to the reference direction 120 can therefore be measured with the sensor 100. The time period for measuring the minimum and maximum resistance values is the same as the period of the varying bias field 132 in certain embodiments.

The varying bias field 132 generates a high saturation field. Determining the resistance using the differential measurement reduces the effects of hysteresis, and the measuring range and accuracy are not primarily limited by magnetic parameters.

Figure 8:
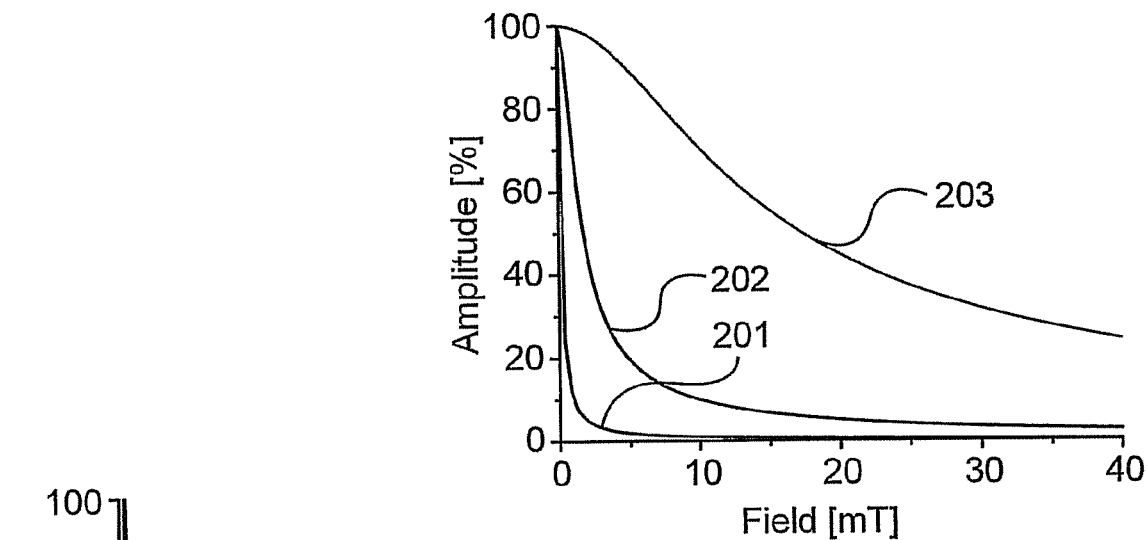
FIG. 8 is a chart illustrating amplitude curves for various bias levels.

Ideally, the output signal is defined as follows:

$$\frac{1}{\sqrt{1+\frac{H_{Mess}^2}{H_{Bias}^2}}}$$

where $H_{Mess}$ and $H_{Bias}$ are the external and bias signals, respectively. FIG. 8 illustrates amplitudes for various output signals corresponding to varying bias signals, with curves 201, 202 and 203 corresponding to bias signals of 0.1 mT, 1 mT and 10 mT, respectively (assuming saturation=0). Since the difference between the maximum and minimum signals at the terminals is evaluated, the output signal is hysteresis-free.

Figure 9:
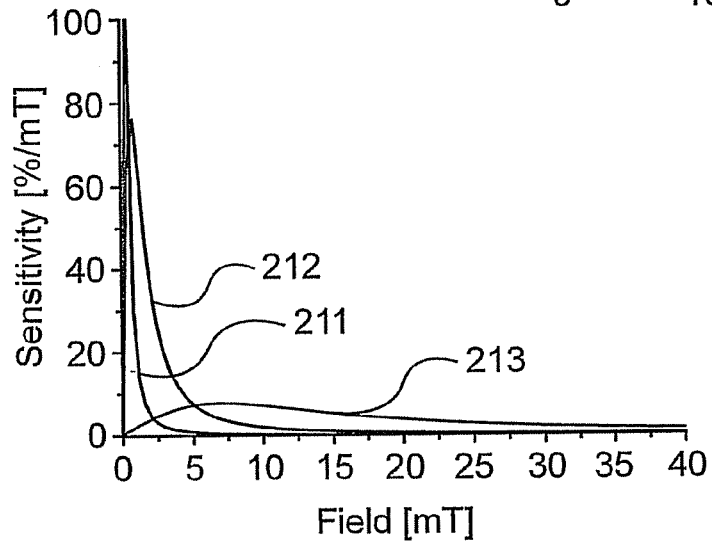
FIG. 9 is a chart illustrating sensitivity curves for various bias levels.
Figure 10:
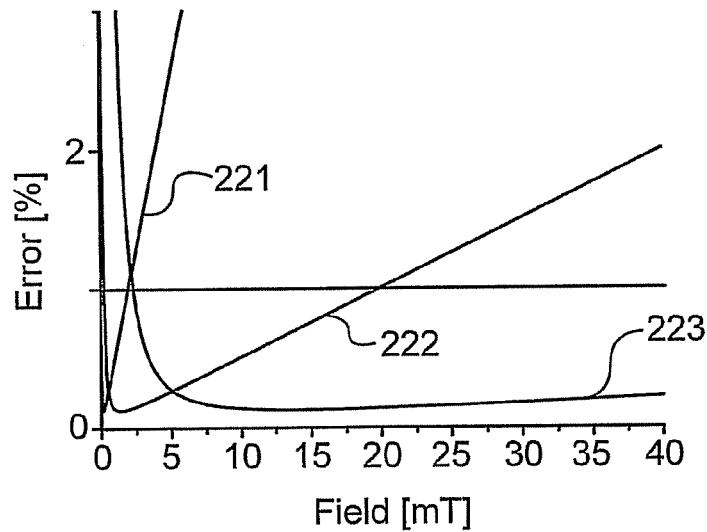
FIG. 10 is a chart illustrating error curves for various bias levels.

The sensitivity depends on the amplitude of the bias field and thus can be adapted for the desired measuring range. FIG. 9 illustrates sensitivities for different bias levels, with curves 211, 212 and 213 corresponding to bias signals of 0.1 mT, 1 mT and 10 mT, respectively. FIG. 10 illustrates relative errors 221, 222 and 223 for bias signals of 0.1 mT, 1 mT and 10 mT, respectively, assuming 0.1% resistance measurement resolution. This can be improved with a higher-resolution evaluation circuit.

The measuring range can be varied by operating the power source 150 so as to adjust the amplitude of the alternating bias field. This can be accomplished during calibration or constantly during the operation of the sensor, for example. Additionally, the varying bias field can be provided with an offset in order to adjust for any asymmetry or offset of the signal curve in the reference direction.

In certain embodiments, an additional constant or varying bias field 133 is established in the direction of the external field 130, thus shifting the zero point so that the low sensitivity range near zero is not reached. This additional bias field can be produced, for example, by applying a voltage to an additional conductive strip or by a permanent magnet. If an offset is provided as noted above, the additional bias field allows self calibration of the sensor.

Figure 11:
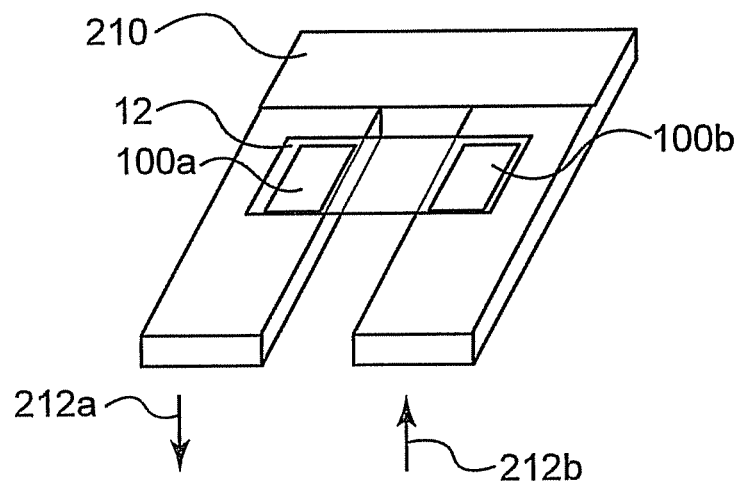
FIG. 11 is a block diagram illustrating portions of a sensor system with two magnetoresistance sensors.

Various schemes for measuring the sensor resistance are envisioned. For example, FIG. 11 illustrates portions of an embodiment that includes two sensors 110a and 100b arranged generally side-by-side on a substrate 12. A generally U-shaped current lead 210 runs under the sensors 100a and 100b, with arrows 212a and 212b indicating current flow through the current lead 210 to establish the external field 130 extending generally perpendicular to the current flow 212a, 212b with different polarities.

In prior art sensors using a constant bias field, the average output of the sensors 100a and 100b would be zero since the sensors are measuring external fields having opposite polarities. However, as disclosed herein, an alternating magnetic bias field is applied so the absolute value of the external field is detected, not the direction of the field. By averaging the outputs of the two sensors 100a, 100b, the absolute values of the external field 130 can be measured.

Figure 12:
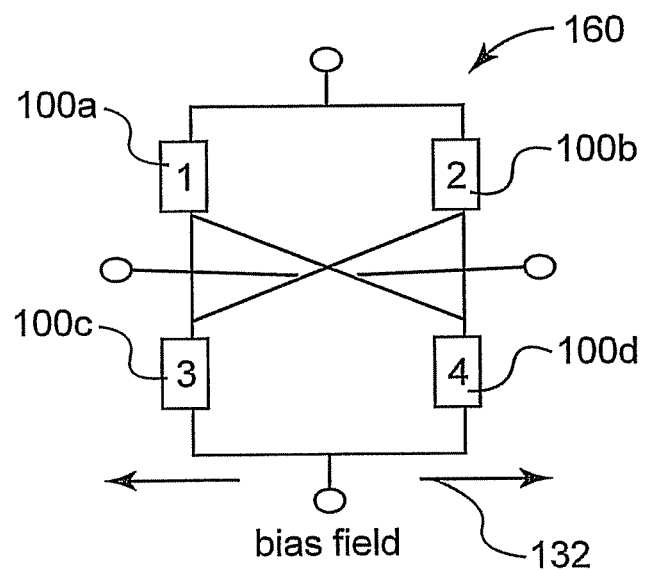
FIG. 12 is a circuit diagram illustrating sensors in a bridge configuration.

FIG. 12 illustrates an embodiment where a plurality of sensors are arranged in a bridge configuration 160. FIG. 12 illustrates a wheatstone bridge 160 with four sensors 100a, 100b, 100c, 100d. The bias field 132 is phase shifted by half a period for sensors 100b and 100d. Alternatively, fixed resistors can be substituted for sensors 100b and 100d, then no phase shifting of the bias field 132 is required. In other embodiments, two sensors are serially connected in a halfbridge and the bias field 132 is phase shifted by half a period for one of the sensors.

Although specific embodiments have been illustrated and described herein, it will be appreciated by those of ordinary skill in the art that a variety of alternate and/or equivalent implementations may be substituted for the specific embodiments shown and described without departing from the scope of the present invention. This application is intended to cover any adaptations or variations of the specific embodiments discussed herein. Therefore, it is intended that this invention be limited only by the claims and the equivalents thereof.

What is claimed is:

1. A semiconductor device, comprising:
a U-shaped conductor having first and second legs;
a first magnetoresistance positioned over the first leg and a second magnetoresistance sensor positioned over the second leg, the first and second magnetoresistance sensors each having:
a first magnetic layer configured to change polarity in response to an external magnetic field, wherein the external magnetic field is generally perpendicular to a reference direction;
a second magnetic layer having a fixed magnetic polarity oriented in the reference direction;
a conductive member situated proximate and electrically isolated from the first and second magnetic layers, and configured to receive a varying voltage to establish a varying magnetic bias field generally parallel to the reference direction;
first and second output terminals coupled to the first and second magnetic layers; and
an evaluation circuit coupled to the first and second output terminals and configured to determine a difference between maximum and minimum resistance values.

2. The semiconductor device of claim 1, further comprising a nonmagnetic layer separating the first and second magnetic layers.

3. The semiconductor device of claim 1, further comprising an antiferromagnetic layer configured to fix the magnetization of the second layer.

4. The semiconductor device of claim 1, wherein the U-shaped conductive member is configured to receive a current such that the current flows from one leg of the U-shape to the other to establish the external magnetic field that is generally perpendicular to the reference direction with different polarities.

5. An electronic system, comprising:
  first and second magnetoresistance sensors each having a first magnetic layer configured to change polarity in response to an external magnetic field, and a second magnetic layer having a fixed magnetic; polarity oriented in a reference direction;
  a substrate, wherein the first and second magnetoresistance sensors are mounted on the substrate;
  a U-shaped conductor situated relative to the substrate such that first and second legs of the U-shape are positioned under the respective first and second magnetoresistance sensors;
  a conductive member situated proximate and electrically isolated from the magnetoresistance sensor;
  a voltage source coupled to the conductive member to establish a varying bias field in the reference direction, wherein the magnetoresistance sensor is configured so that a resistance of the magnetoresistance sensor varies in response to the external magnetic field, wherein the external magnetic field is generally perpendicular to the reference direction;
  an evaluation circuit coupled to the magnetoresistance sensor configured to determine a difference between maximum and minimum resistance values in response to the external magnetic field, including averaging outputs of the first and second magnetoresistance sensors.

6. The electronic system of claim 5, further comprising a nonmagnetic layer separating the first and second magnetic layers.

7. The electronic system of claim 5, further comprising an antiferromagnetic layer configured to fix the magnetization of the second layer.

8. The electronic system of claim 5, wherein the magnetoresistance sensor has a shape anisotropy.

9. The electronic system of claim 5, wherein the first and second magnetoresistance sensors are arranged in a bridge configuration.

10. The electronic system of claim 5, wherein the U-shaped conductive member is configured to receive a current such that the current flows from one leg of the U-shape to the other to establish the external magnetic field that is generally perpendicular to the reference direction with different polarities.

11. A magnetic sensing method, comprising:
  providing first and second magnetoresistance sensors mounted on a substrate and situates relative to a U-shaped conductor such that first and second legs of the U-shape are positioned under the respective first and second magnetoresistance sensors;
  applying a varying magnetic bias field in a reference direction;
  applying an external magnetic field perpendicularly to the reference direction;
  determining a maximum resistance value of the sensor in response to the external magnetic field;
  determining a minimum resistance value of the sensor in response to the external magnetic field; and
  determining the difference between the maximum and minimum resistance values.

12. The method of claim 11, wherein applying the varying magnetic bias field includes applying a varying voltage to a conductor situated proximate and electrically isolated from the magnetoresistance sensor.

13. The method of claim 11, wherein a time period for measuring the minimum and maximum resistance values is the same as a period of the varying magnetic bias field.

14. The method of claim 11, further comprising applying an additional bias field in the direction of the external magnetic field.

15. The method of claim 11, wherein providing the magnetoresistance sensor includes providing a magnetoresistance sensor having first and second magnetic layers, wherein the first layer changes polarity in response to the external magnetic field and the second magnetic layer has a fixed magnetic polarity oriented in the reference direction.

16. The magnetic sensing method of claim 11, wherein applying the external magnetic field perpendicularly to the reference direction includes applying current to the first leg of the U-shaped conductive member such that the current flows from the first leg to the second leg.

* * * * *